July 1, 1958 L. E. BARTON 2,841,702

SEMI-CONDUCTOR AUTOMATIC GAIN CONTROL SYSTEM

Filed July 24, 1953 2 Sheets-Sheet 1

INVENTOR.
LOY E. BARTON

BY

ATTORNEY

July 1, 1958 L. E. BARTON 2,841,702

SEMI-CONDUCTOR AUTOMATIC GAIN CONTROL SYSTEM

Filed July 24, 1953 2 Sheets-Sheet 2

INVENTOR.
LOY E. BARTON

BY H. C. Newton

ATTORNEY 2,841,702

SEMI-CONDUCTOR AUTOMATIC GAIN CONTROL SYSTEM

Loy E. Barton, Princeton, N. J., assignor to Radio Corporation of America, a corporation of Delaware Application July 24, 1953, Serial No. 370,129

12 Claims. (Cl. 250—20)

Figure 1:
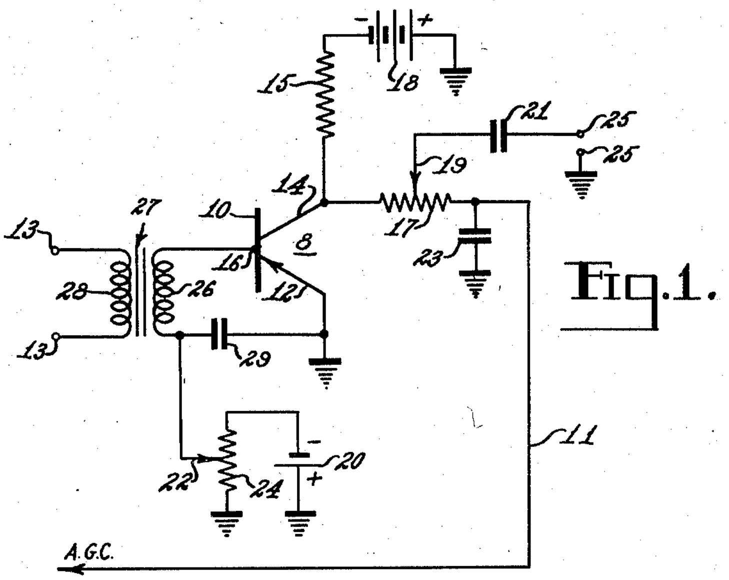

This invention relates to automatic gain control systems for radio signal receivers and the like, and in particular to such systems for signal receivers employing semi-conductor devices in the signal translating portions thereof.

Signal receivers employing vacuum tubes have generally been provided with an automatic gain control (AGC) system for maintaining the radio signal applied to the second detector substantially constant over a relatively wide range of variation in the amplitude of the received signal. This is generally accomplished by rectifying a portion of the received radio signal to produce a negative direct current voltage which is proportional to the average value of the signal and applying it to the grids of the radio-frequency, intermediate frequency, and converter tubes of the receiver to control the gain thereof inversely with respect to the signal strength, an increase in the signal increasing the negative bias on the grids and reducing the amplification factor or gain of the tubes. By providing an AGC system for a receiver, it may be tuned from strong to relatively weak signals without the necessity of resetting the manual gain or volume control.

Typically, AGC action is obtained in electron-tube circuits by deriving a direct current negative voltage proportional to the amplitude of received radio-frequency signals at the input terminals of a diode detector. In order to prevent the application of this negative voltage to the grids of the tubes and the consequent reduction in their gain during the reception of weak signals, it is customary to employ a second diode or rectifying device which remains inoperative until the signal exceeds a certain amplitude. This function is usually referred to as delay action and while improving the AGC characteristics, it involves the use of an extra diode.

In addition to employing delay action, the characteristics can be further improved by amplifying the AGC voltage. This may be accomplished by either using a separate intermediate frequency amplifier tube followed by a separate diode, or by using a separate direct current amplifier tube which increases the magnitude of the bias voltage before application to the controlled tubes. While improving the receiver performance, these methods involve the use of at least one extra tube, and are consequently relatively costly.

It is also possible to provide AGC action in electron-tube signal receivers which employ anode detection of an amplifier tube to derive the original intelligence or modulation component. In order to obtain an AGC control voltage of the proper polarity, however, an extra electron-tube is necessary for such an AGC system. Thus, it is apparent that satisfactory AGC performance in signal receivers employing vacuum tubes invariably requires the use of one or more additional tubes.

Recently, semi-conductor devices such as transistors, which employ a semi-conductive element and at least three contacting electrodes have been the subject of some investigation for use in signal receivers as well as other types of signal conveying equipment. Transistors, as is well known, may be used as signal amplifiers and have the advantages of small size, durability, low power requirements, and a long useful life. While these benefits of transistors recommend their use in many types of equipment in which vacuum tubes have heretofore been almost exclusively employed, the differing characteristics of transistors, as opposed to vacuum tubes, have made it usually necessary either to adapt the external circuits of the equipment or construct completely new circuits to accommodate the peculiar characteristics of transistors.

Soon after the first transistors were developed and operated, efforts were made to incorporate them in known electron-tube signal conveying systems of all types. These efforts have been successful, and even at this early date, radio receivers have been constructed and satisfactorily operated which use transistors exclusively. In developing radio receivers employing transistors, the advantages of incorporating an AGC system in the receiver were suggested from past experiences with electron-tube receivers which used AGC systems with such a high degree of success.

Initially, AGC systems for radio receivers employing transistors exclusively have rather closely paralleled the known AGC systems for electron-tube circuits. Hence, for example, a direct-current voltage proportional to the radio-frequency signal is developed by rectifying a portion of the radio-frequency signal with a diode and applying the resultant D.-C. voltage to the electrodes of several transistor amplifying stages to reduce the bias thereof and consequently the gain.

Several disadvantages accompany this and other known types of transistor AGC systems. For one, they involve the use of a separate AGC diode, which is costly and space consuming. Secondly, and just as, if not more important, such AGC systems have been observed to be accompanied by considerable signal distortion. Ideally, an AGC system should not affect the receiver amplification until the incoming signal has reached a level sufficient to produce a predetermined adequate audio-frequency or modulation signal output voltage, and then, with larger signals, should maintain the output voltage constant. Hence, in electron-tube circuits, it is customary to employ delay or AGC amplification in an effort to approach this ideal. In contrast with the ideal, however, the known AGC systems for radio receivers employing transistors reduce the gain of the receiver as soon as the AGC diode begins to develop an output voltage.

Accordingly, it is a principal object of the present invention to provide an improved AGC system for radio signal receivers and the like employing semi-conductor devices as signal translating and amplifying means wherein the AGC action may be delayed effectively and the output signal is subject to a minimum of distortion.

It is another object of the present invention to provide an improved AGC system for radio signal receivers and the like employing semi-conductor devices as signal translating and amplifying means, wherein no extra circuit elements are necessary and which is of relatively low cost construction and efficient in operation.

It is a further object of the present invention to provide a simple and efficient AGC system of improved construction for radio signal receivers whereby substantially uniform amplitude output signals are derived in response to received signals above a predetermined minimum value.

These and further objects of the present invention are achieved by deriving an AGC direct-current voltage proportional to the incoming signal on the collector of a transistor second detector stage. This voltage is used to bias the electrodes of a second intermediate frequency transistor amplifier. The AGC bias for the electrodes of a first intermediate frequency transistor amplifier is obtained from an electrode of the second in such a manner that the first intermediate frequency amplifier is first reduced in gain, this sequence of gain reduction being responsible for reduced distortion and more efficient operation. Since the AGC source is the second detector transistor, no extra circuit elements are necessary, thus achieving circuit simplicity which has not been heretofore possible in the known electron-tube or transistor AGC systems employed in radio receivers.

Figure 2:
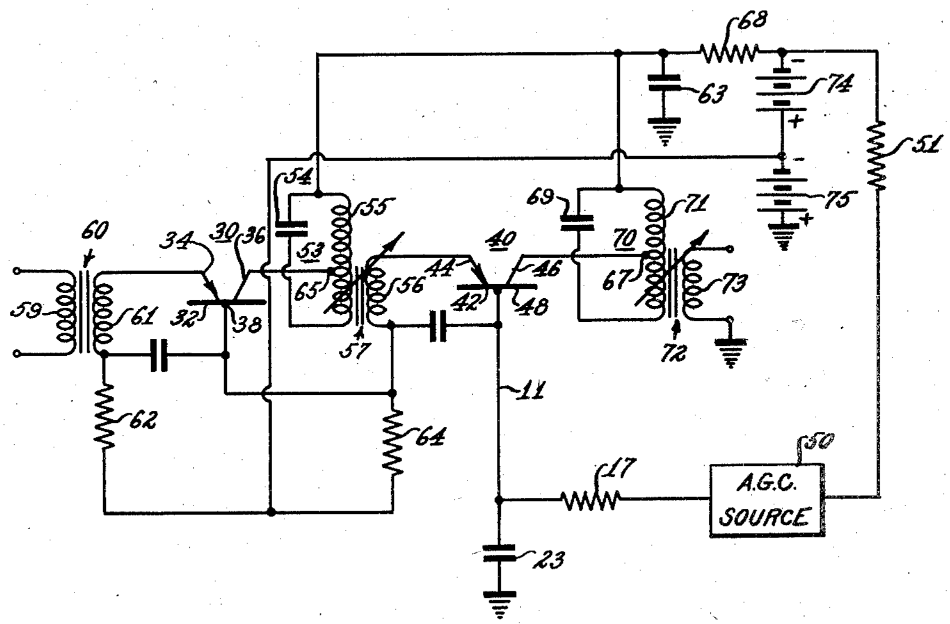
Figure 3:
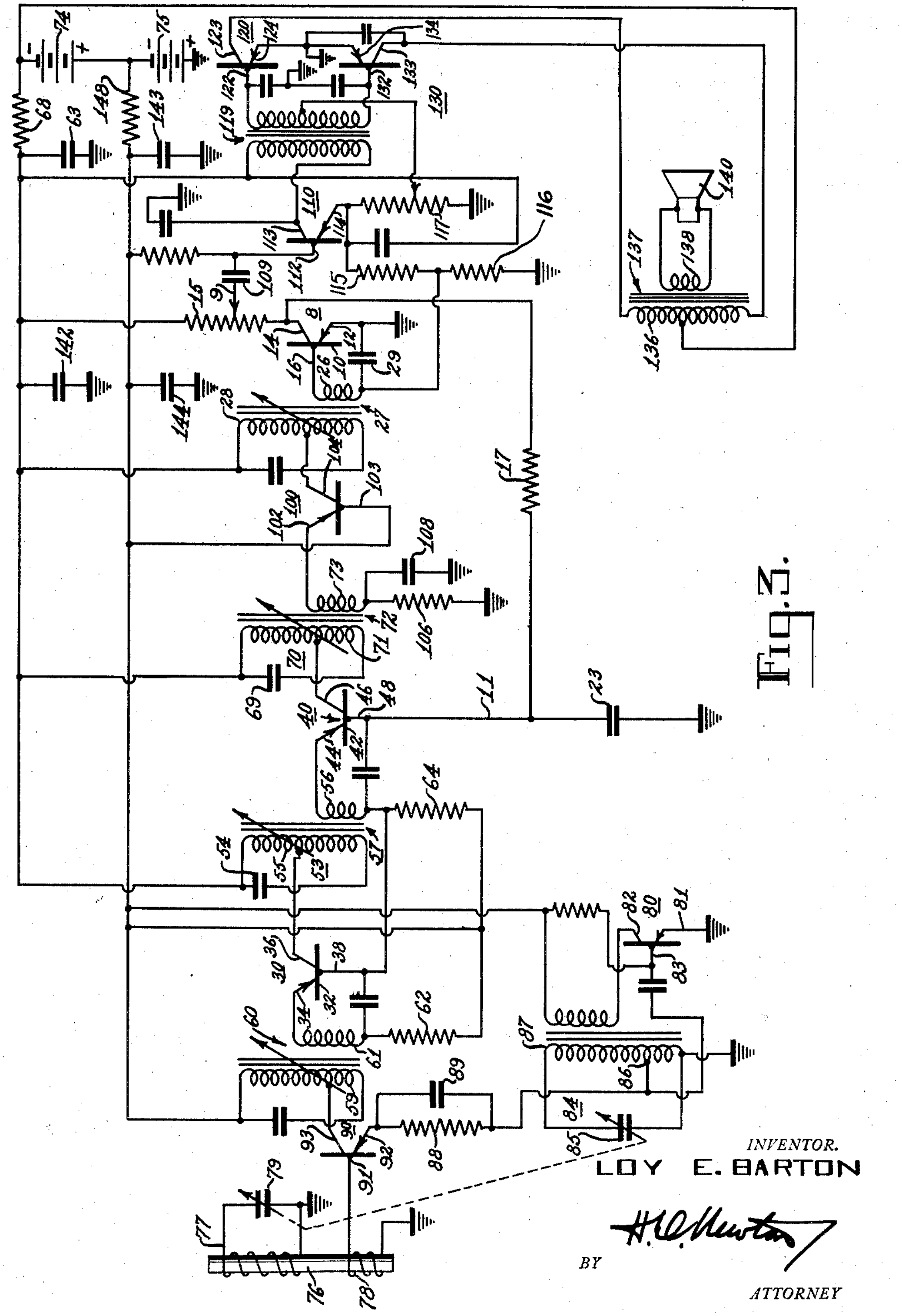

The novel features that are considered characteristic of this invention are set forth with particularity in the appended claims. The invention itself, however, both as to its organization and method of operation, as well as additional objects and advantages thereof, will best be understood from the following description when read in connection with the accompanying drawing, in which:

Figure 1 is a schematic circuit diagram of a transistor detector and AGC system for a radio signal receiver embodying the present invention;

Figure 2 is a schematic circuit diagram of first and second intermediate frequency transistor amplifiers for radio signal receivers and the like embodying an AGC system in accordance with the invention; and Figure 3 is a schematic circuit diagram of an all-transistor radio signal receiver showing the application of an AGC system embodying the present invention to the various signal translating portions thereof.

Referring now to the drawing wherein like elements are designated by like reference numerals throughout the figures and referring particularly to Figure 1, a transistor 8 comprises a semi-conductive body 10 having three contacting electrodes which are designated as an emitter 12, a collector 14, and a base 16. The transistor 8 is illustrated as being of the P–N–P junction type, although it should be understood that throughout the description, the use of P–N–P junction type transistors is merely for the purpose of illustration and N–P–N junction transistors may be used by reversing the polarity of the biasing potentials. The transistor 8 is biased to be operative as a square law detector for separating the modulation component from the received signal, and accordingly, its electrodes are biased to operate over a non-linear portion of the collector current-collector voltage characteristic curve. To this end a pair of batteries 18, 20 may be provided; the negative terminal of battery 18 being connected through a load resistor 15 to the collector 14 and the negative terminal of battery 20 being connected through a tap 22 of a voltage dividing potentiometer 24 and the secondary winding 26 of the R. F. coupling transformer 27 to the base 16. By way of example only, the position of the tap 22 of the potentiometer is normally adjusted to put a negative voltage of approximately .12 volt on the base 16 for normal room temperature operation, while the battery 18 preferably will have a voltage rating of 9 volts.

The emitter 12 is connected to a source of fixed potential or ground for the system and through a capacitor 29 and the secondary winding 26 of the transformer 27 to the base 16. The capacitor 29 will prevent the application of direct current voltages from the battery 20 to the emitter 12. By biasing the electrodes of the transistor 8 in the foregoing manner, the emitter 12 will be slightly positive with respect to the base 16, while the collector 14 will be negative with respect to the base. Thus the emitter will be biased in a relatively conducting direction and the collector 14 will be biased in a relatively non-conducting direction, each with respect to the base 16.

Output signals from the transistor detector 8 are taken from across a resistor 17 which is connected from the junction of collector 14 and the load resistor 15. To this end, a variable tap 19 is provided which is coupled through an output coupling capacitor 21 to one of the output terminals 25, the other of which is grounded.

By making the position of the tap 19 adjustable, volume control for the circuit is provided. In addition, the resistor 17 in combination with a capacitor 23 connected to ground as shown comprise an AGC filter. Alternately, output signals may be taken from across the load resistor 15 in the collector circuit as will be explained hereinafter by providing a similar adjustable tap for volume control purposes. It has been found that the output connection illustrated in Figure 1 is effective in some instances to prevent regenerative feedback and thus unwanted oscillations when the transistor detector is connected for operation in a radio receiver.

Automatic gain control currents are also derived in the collector circuit of the transistor detector 8 as will be presently explained. To this end, an AGC output lead 11 is connected from the junction of the resistor 17 and capacitor 23, which filter the unwanted alternating current signals.

For static operating conditions (i. e., in the absence of alternating current signals), direct current will flow into the emitter 12 and out the collector 14 to the negative terminal of the biasing battery 18 and out the base 16 to the negative terminal of battery 20. When alternating current signals, such as for example, intermediate frequency signals, are applied by way of the input terminals 13 of the transformer 27 to the transistor 8, they will be detected, and an alternating current signal representative of the original signal will appear in the collector circuit. As the incoming alternating current signal increases in amplitude, it will cause a corresponding and proportional increase in the direct current flowing in the collector 14. Thus, increases in the applied alternating current signal will cause a larger current to flow through the load resistor 15, making the AGC output lead 11 more positive. In this manner the increase in potential of the collector electrode may be used as the direct current source for AGC purposes.

While it will be understood that the circuit specifications may vary according to the design for any particular application, the following circuit specifications are included for the circuit of Figure 1 by way of example only:

Resistors 15 and 17: 10,000 ohms each
Capacitors 21, 23 and 29: 4, 20 and 0.1 microfarads, respectively.

In Figure 2, reference to which is now made, a first transistor amplifier 30 and a second transistor amplifier 40 are coupled together through an interstage coupling transformer 57 having primary and secondary windings 55 and 56 respectively. The primary winding 55 of the transformer is connected in parallel with a capacitor 54 to form a parallel tuned circuit 53. The tuned transformer thus provides frequency selectivity as well as proper impedance matching between the two transistor amplifiers 30 and 40.

Each of the transistors have been illustrated as being, by way of example only, a P–N–P junction transistor comprising a semi-conductive body and three contacting electrodes. Thus the transistor 30 comprises a semi-conductive body 32 and an emitter 34, a collector 36, and a base 38 each in contact therewith, and the transistor 40 comprises a semi-conductive body 42, and an emitter 44, a collector 46, and a base 48 each in contact with the body 42.

To properly bias the second transistor amplifier 40, its collector 46 is connected through a tap 67 on the primary winding 71 of a second interstage coupling transformer 72, and part of the primary winding 68 to the negative terminal of a battery 74. The combination of a series resistor 68 and a parallel capacitor 63 provide a filter for radio frequency signals. The transformer 72 includes a parallel tuned primary circuit 70 and may be identical with the transformer 57, providing frequency selectivity for the circuit and impedance matching between stages.

The emitter 44 of the second transistor amplifier is connected through the secondary winding of interstage transformer 57 and the biasing resistor 64 to the negative terminal of a 4.5 volt battery 75. The base 48 of transistor 40 may get its bias from the negative terminal of a 9.0 volt battery 74 through a series resistor 51 and a portion of the AGC source as indicated. Thus the base 48 will be slightly negative with respect to the emitter 44 and positive with respect to the collector 46. As is well known and understood, for this biasing arrangement, the emitter is referred to as being biased in a relatively conducting or forward direction and the collector in a relatively non-conducting or reverse direction, each with respect to the base electrode. This is normal bias for transistor amplification action.

Base bias for the first transistor amplifier 30 is obtained by the emitter current of the second transistor amplifier 40 which causes a potential drop across the biasing resistor 64. The emitter 34 of the first transistor amplifier 30 is connected through the secondary winding 61 of an input coupling transformer 60 and the biasing resistor 62 to the negative terminal of the 4.5 volt battery 75. The biasing resistors 62 and 64 in series with the emitters 34 and 44 respectively are effective to minimize the effect of temperature variations. By connecting the electrodes of transistor 30 as shown it also will be biased for transistor amplification action, i. e., its emitter will be biased in a relatively conducting direction and its collector in a relatively non-conducting direction, each with respect to the base electrode.

An AGC system for the transistor amplifiers is provided by connecting a source of direct-current AGC potential 50 through a radio-frequency filter, comprising a series resistor 17 and a capacitor 23 connected to ground, to the base 48 of the second transistor amplifier 40. It is assumed that the potential of the AGC source 50 decreases with respect to ground or becomes less negative with increases in the signal strength.

If an alternating current signal is applied through the input coupling transformer 60 to the emitter 34 of the first transistor amplifier 30, an amplified version of this signal will appear in the collector 36. This signal will then be coupled through the tuned interstage coupling transformer 57 to the emitter 44 of the second transistor amplifier 40 where it will be further amplified. The resultant signal which appears in the collector 46 may be coupled through the output coupling transformer 72 to as many further amplifier stages as desired.

By providing an AGC system as shown in Figure 2, signal distortion due to AGC is minimized and practically eliminated. This is accomplished because the first transistor amplifier 30 has its gain reduced more rapidly than the gain of the second transistor amplifier. In operation, if it is assumed that the AGC source provides an increasing positive potential with increases in signal strength, the base 48 of the second transistor amplifier 40 will become more positive as the incoming signal increases. This increase of the potential on the base 48 will reduce the forward bias between the emitter 44 and the base 48, or essentially reduce the gain of the transistor 40. Decreasing the forward bias between the base 48 and emitter 44 will reduce the current flowing from the emitter 44 into the body 42, thus decreasing the potential drop across the biasing resistor 64 in the base circuit of the first transistor 30. Decreasing this bias will make the base 38 of transistor 30 less negative, decreasing the bias in the forward direction between the base 38 and the emitter 34 (i. e., reducing the gain of transistor 30) until, depending on the circuit parameters and the particular transistor characteristics, the transistor 30 will be cut off. Since these values are so chosen that the first transistor 30 can have a small bias after its gain becomes a minimum, its gain will be a minimum before the emitter current and the gain of the second transistor 40 become a minimum. Consequently the second transistor 40 will cut off last and will follow the first transistor 30 which has the earlier cut off. This sequence of gain reduction has been found to reduce distortion due to the AGC action.

While it will be understood that the circuit specifications may vary according to the design for any particular application, the following circuit specifications are included for the circuit of Figure 2 by way of example only:

Resistors 17, 62, 64 and 68: 10,000; 1500; 1500; and 56 ohms, respectively

Capacitors 23 and 63: 10 and 50 microfarads, respectively

Capacitors 54 and 69: 100 micromicrofarads each

In Figure 3, a superheterodyne radio receiver embodying circuits of the type illustrated in Figures 1 and 2 includes generally a loop antenna 78, a transistor oscillator element 80, a transistor mixer 90, first, second, and third intermediate frequency transistor amplifiers 30, 40, and 100 respectively, a transistor second detector 8, a transistor driver amplifier 110, two push-pull transistor amplifiers 120, 130 and a loudspeaker or other utilization means 140. Biasing potentials for the several transistor stages are obtained from the batteries 74 and 75, which may have voltage ratings of 9 and 4.5 volts, respectively.

The loop antenna 76 comprises a ferrite rod having an input winding 77 which is connected in parallel with a tuning capacitor 79 which tunes the antenna to the desired incoming signal. The signal thus received is coupled through an antenna coupling winding 78 to the base 91 of the transistor mixer 90. The oscillator element includes a P–N–P junction transistor 80 having a grounded emitter 81, a collector 82, and a base 83 and a parallel resonant tank circuit 84 which is tunable by means of a variable capacitor 85 which is gang connected for unitary operation with the antenna tuning capacitor 78, as shown. The oscillator is of the well known feedback type, sustained oscillation being obtained by virtue of regenerative feedback between the collector 82 and the base 83 of the transistor 80. The developed oscillatory signals are coupled from a tap 86 on the inductor 87 of the tank circuit 84 through the resistor 88, which is shunted by by-pass capacitor 89, to the emitter 92 of transistor mixer 90, which is also a P–N–P junction transistor.

If it is assumed that the bias for the emitter 92 of mixer 90 is initially excessive, this excess bias will be limited or bucked by the current through the resistor 88. For temperature increases, therefore, the emitter current through the resistor 88 will increase, limiting the emitter bias, and for temperature decreases the emitter current through resistor 88 will decrease, decreasing the bias to an approximate value necessary for efficient operation of the mixer. Thus resistor 88 minimizes the effects of temperature variations in transistor 90 as well as oscillator voltages and permits the interchanging of different transistors. The resistor 88 may have a resistance of 5600 ohms.

The incoming signals are heterodyned with the local oscillator signals in the transistor mixer 90 to produce a beat or intermediate frequency signal which appears in the collector 93 of the transistor mixer 90. The intermediate frequency signal is then coupled through a first interstage tuned transformer 60 to the emitter 34 of the first intermediate frequency amplifier transistor 30. The transformer 60 is tuned to the intermediate frequency signal and provides frequency selectivity as well as impedance matching between the output or collector circuit of the transistor mixer 90 and the input or emitter circuit of transistor amplifier 30. The transistor amplifier 30 may be identical with the one illustrated in Figure 2 of the drawing, and has its collector 36 connected to a tap on the primary winding 55 of the second interstage coupling transformer 57. The secondary winding 56 of this transformer is connected to the emitter 44 of the second intermediate frequency transistor amplifier 40 in the same manner as in the circuit illustrated and described in connection with Figure 2. The collector 46 of the second transistor amplifier 40 is connected to a tap on the primary winding 71 of a third tuned interstage coupling transformer 72, the secondary winding 73 of which is connected to the emitter 102 of the third intermediate frequency transistor amplifier 100. The secondary winding is also connected through an emitter biasing resistor 106 to ground. The resistor 106 is shunted by a by-pass capacitor 108 and serves to minimize the effects of temperature variations of transistor 100 as well as serving as the biasing source for the emitter 102. The resistor 106 preferably has a resistance of 6800 ohms.

The output circuit or collector 104 of the third transistor amplifier 100 is connected to a tap on the primary winding 28 of the final intermediate frequency interstage coupling transformer 27, the secondary winding 26 of which is connected to the base 16 of the second transistor detector 8. The transistor detector 8 will be recognized as being practically identical with the one illustrated in Figure 1, the sole difference being in the signal output connection. In this case the output signals are taken from across the load resistor 15 in the collector circuit by means of an adjustable tap 9 which forms a potentiometer with the resistor 15 for volume control purposes.

The detected audio signals are then coupled through a coupling or blocking capacitor 109 to the base 112 of a transistor driver amplifier 110 which also has a collector 113 and an emitter 114 as shown and is biased for class A operation. Emitter bias for the emitter 114 of the transistor driver 110 and base bias for the base 16 of the transistor detector 8 is obtained from a voltage divider comprising the resistors 115 and 116 which are connected from the emitter 114 to ground. To this end, the base 16 of the transistor detector 8 is connected through the secondary winding 26 of coupling transformer 27 to the junction of resistors 115 and 116. A further tapped resistor 117 which is connected from the emitter 114 to ground in parallel with resistors 115 and 116 serves to bias the bases 122 and 132 of the two push-pull output transistors 120 and 130, respectively.

The resistance of resistors 115, 116 and 117 may be, by way of example, 18,000, 100 and 1500 ohms respectively, when using batteries 74 and 75 having voltage ratings of 9 and 4.5 volts, respectively.

The collector 113 of the transistor driver 110 is coupled through coupling transformer 119 to the push-pull output stage which includes two transistor amplifiers 120 and 130, which are biased for class B operation as is well known. The collectors 123 and 133 of the transistors 120 and 130, respectively are connected to either end of the primary winding 136 of an output coupling transformer 137, which provides proper impedance matching between the push-pull output stage and the load which has been illustrated as being a loudspeaker 140 but may be any other suitable utilization device. Output audio-frequency signals from the push-pull output transistors 120 and 130 may then be combined in the primary winding 136 and coupled through the secondary winding 138 to the loudspeaker 140. The emitters 124 and 134 of the output transistors 120 and 130, respectively, are grounded to a common point such as the chassis of the receiver.

The capacitors 63, 142, 143 and 144 as well as the resistors 68 and 148 serve as filtering means for radio frequency signals as is well known and understood.

In operation, incoming signals will be received by the loop antenna 76 at a frequency which will be determined by adjustments of the tuning capacitor 79. At the same time, the oscillator tank circuit 84 will be tuned to resonance at the proper oscillator frequency by means of the variable tuning capacitor 85. The local oscillator signal and the incoming signal will then be heterodyned together by the transistor mixer 90, to produce a resultant beat or intermediate frequency signal.

The intermediate frequency signal from the transistor mixer 90 will be coupled through the first coupling transformer 60 to the emitter 34 of the first transistor intermediate frequency amplifier 30. This amplified signal will then be amplified by the second transistor intermediate frequency amplifier 40 and again by the third transistor intermediate frequency amplifier 100.

The amplified signal which finally appears in the collector 104 will be coupled through the third intermediate frequency coupling transformer 27 to the base 16 of the transistor detector 8 where the modulation component will be separated from the received signal. The resulting audio-frequency signal in the emitter 12 of transistor detector 8 will be coupled through the tap 9 on load resistor 15 and the coupling capacitor 109 to the base 112 of the transistor driver amplifier 110. The out-of-phase signals which are then applied to the bases 122 and 132 of the push-pull output transistors 120 and 130, respectively, will be amplified in the push-pull stage and then combined in the primary winding 136 of the output transformer 137. This signal will then be coupled through transformer 137 to the loudspeaker 140 or other utilization means.

As the signal increases in strength, more current will flow in the collector 14 of the transistor detector 8. This will cause a greater voltage drop across the load resistor 15 in the collector circuit, making the lead 11 more positive. This decrease in the negative collector voltage is used, in accordance with the present invention to obtain AGC action.

As the collector 14 of the transistor detector 8 becomes more positive (i. e. less negative) the base 48 of the second transistor amplifier 40 will also become more positive or, in other words, will be biased less negatively. Series resistor 17 and the capacitor 23 to ground in the AGC conductive path from the collector 14 to the base 48 provides filtering action as is well known. The increase of positive potential on the base 48 reduces the forward bias between the emitter 44 and the base 48. This will, in essence, reduce the gain of the second intermediate frequency transistor amplifier 40.

This decrease in the forward bias of transistor 40 reduces the current flowing from the emitter 44 into the semi-conductive body 42, thus decreasing the voltage drop across the biasing resistor 64, making the base 38 of transistor 30 less negative and decreasing the bias in the forward direction between the base 38 and the emitter 34. This will reduce the gain of transistor 30 until it is cut off. Because of the arrangement described, the second intermediate frequency transistor amplifier 40 cuts off last, and consequently distortion due to the inclusion of the AGC system is minimized, while all the aforementioned advantages of such a system are realized.

As shown herein, an automatic gain control system for radio signal receivers and the like employing semiconductor devices or transistors as signal translating and amplifying elements, may utilize a minimum of circuit elements. In addition to simplicity and reliability, the AGC system provided by the present invention has been found to contribute a minimum of distortion to a signal receiver.

What is claimed is:

1. In a signal receiver, the combination comprising, signal detection means including a semi-conductor device having a semi-conductive body and an emitter, a base, and a collector electrode in contact therewith, said semiconductor device having a characteristic wherein potential variations of said collector electrode are proportional to variations in the amplitude of an applied alternating current signal, a first and second signal amplifying device each having a semi-conductive body, and a common, an input, and an output electrode in contact therewith, means coupling the output electrode of said first device with the input electrode of said second device, means coupling the output electrode of said second device with said base electrode, biasing means for each of said electrodes including means wherein the input electrode current of said second device is operative to bias the common electrode of said second device, and conductive circuit means coupled between said collector electrode and the common electrode of said second device wherein the potential variations of said collector electrode are applied to the common electrode of said second device to vary the gain and the input electrode current of said second device thereby to vary the gain of said first device, the gain of said first device being thereby decreased more rapidly than the gain of said second device.

2. An automatic gain control system for radio receivers and the like comprising in combination, a first and a second semi-conductor signal amplifying device each having a semi-conductive body and a common, an input, and an output electrode in contact therewith, impedance matching means coupling the output electrode of said first device with the input electrode of said second device, means coupled with the input electrode of said first device for applying an alternating current signal thereto, conductive circuit means including a resistor coupling the input electrode of said first device with the input electrode of said second device, means coupling the common electrode of said first device with said conductive means, a semi-conductor signal-detection device having a semi-conductive body and an emitter, a base, and a collector electrode in contact therewith, said signal-detection device having a characteristic wherein potential variations of said collector electrode are proportional to variations in the amplitude of said alternating current signal, means coupling the output electrode of said second device with said base electrode, load means including a signal output path connected with said collector electrode, biasing means for each of said electrodes, and conductive circuit means coupling said collector electrode with the common electrode of said second device wherein potential variations of said collector electrode are applied to the common electrode of said second device, said potential variations being effective to alter the gain of said second device thereby to vary the current in said conductive circuit means to alter the gain of said first device, the gain of said first device being thereby decreased more rapidly than the gain of said second device.

3. In a radio receiver the combination comprising, a first and a second semi-conductor signal amplifying device each having a semi-conductive body and a base, an emitter, and a collector electrode in contact therewith, means connecting said base electrodes to a point of reference potential, means coupling the collector electrode of said first device with the emitter electrode of said second device, means coupled with the emitter electrode of said first device for applying an alternating current signal thereto, conductive circuit means including a series biasing resistor coupling the emitter electrode of said first device with the emitter electrode of said second device, means connecting the common electrode of said first device to the junction of said resistor and the emitter electrode of said second device, biasing means for applying operating potentials to each of said devices, a source of automatic gain control potential for controlling the gain of said first and said second device, said source having a characteristic wherein the automatic gain control potential approaches said reference potential with increases in amplitude of said alternating current signals, and means coupling said source with the base electrode of said second device wherein potential variations of said source are applied to the base electrode of said second device, said potential variations being effective to decrease the current gain of said second device wherein the current in said conductive circuit means and said series biasing resistor is decreased thereby to decrease the current gain of said first device, the gain of said first device being thereby decreased more rapidly than the gain of said second device.

4. An automatic gain control system for radio receivers and the like comprising in combination, semi-conductor signal detection means for providing an automatic gain control potential proportional to a received signal and including a semi-conductive body, and a base, an emitter, and a collector electrode in contact therewith, a first semi-conductor signal amplifying device coupled with the base electrode of said signal detection means having a semi-conductive body and a base, an emitter, and a collector in contact therewith, said base electrode being responsive to said automatic gain control potential for controlling the gain of said first signal amplifying device, a second semi-conductor signal amplifying device coupled with said first signal amplifying device and having at least an input electrode, and conductive circuit means coupled with the input electrode of said second signal amplifying device and adapted to be traversed by the current through the emitter electrode of said first signal amplifying device to control the gain of said second device, the gain of said second device being thereby decreased more rapidly than the gain of said first device.

5. In a radio receiver the combination comprising, a first and a second signal amplifying device each having a semi-conductive body and a common, an input, and an output electrode in contact therewith, means coupling the output electrode of said first device with the input electrode of said second device, means coupled with the input electrode of said first device for applying an alternating current signal thereto, conductive circuit means coupling the input electrode of said first device with the input electrode of said second device, means coupling the common electrode of said first device with said conductive circuit means, signal detection means including a semi-conductor device having a semi-conductive body and an emitter, a base, and a collector electrode in contact therewith, said semi-conductor device having a characteristic wherein potential variations of said collector electrode are proportional to variations in the amplitude of said alternating current signal, means coupling the output electrode of said second device with said base electrode, biasing means for each of said electrodes, and means coupling said collector electrode with the common electrode of said second device wherein potential variations of said collector electrode are applied to the common electrode of said second device, said potential variations being effective to alter the gain of said second device thereby to vary the current in said conductive circuit means to alter the gain of said first device, the gain of said first device being thereby decreased more rapidly than the gain of said second device.

6. In a radio receiver the combination comprising, a first and a second semi-conductor device having a semi-conductive body and a common, an input, and an output electrode in contact therewith, means coupling the output electrode of said first device with the input electrode of said second device, means coupled with the input electrode of said first device for applying an alternating current signal thereto, conductive circuit means coupling the input electrode of said first device with the input electrode of said second device, means connecting the common electrode of said first device to said conductive circuit means, means including a source of potential for biasing each of said devices, a source of potential having a characteristic wherein variations in the amplitude of said alternating current signal cause variations of the potential of said source, and means coupling said source with the common electrode of said second device wherein potential variations of said source are applied to the common electrode of said second device, said potential variations being effective to alter the current gain of said second device wherein the current in said conductive means is varied thereby to alter the current gain of said first device, the gain of said first device being thereby decreased more rapidly than the gain of said second device.

7. In a radio receiver the combination comprising, a first and a second semi-conductor signal-amplifying device each having a semi-conductive body and a base, an emitter, and a collector electrode in contact therewith, tuned impedance matching means coupling the collector electrode of said first device with the emitter electrode of said second device, means coupled with the emitter electrode of said first device for applying an alternating current signal thereto, conductive circuit means including a series biasing resistor coupling the emitter electrode of said first device with the emitter electrode of said second device, means connecting the common electrode of said first device to the junction of said resistor and the emitter electrode of said second device, a semi-conductor signal detector device having a semi-conductive body and an emitter, a base, and a collector electrode in contact therewith, said signal detector device having a characteristic wherein the collector electrode potential increases with increases in the amplitude of said alternating current signal, means coupling the collector electrode of said second device with the base electrode of said signal detector device, load means including a series resistor connected with the collector electrode of said signal detector device, a conductive output circuit coupled with said series resistor, biasing means for each of said electrodes, and means coupling the collector electrode of said signal detector device with the base electrode of said second device wherein potential increases of the collector electrode of said signal detector device are applied to the base electrode of said second device, said potential increases being effective to decrease the current gain of said second device wherein the current in said conductive circuit means and said series biasing resistor is decreased thereby to decrease the current gain of said first device, the gain of said first device being thereby decreased more rapidly than the gain of said second device.

8. In a radio receiver the combination comprising, a first and a second signal amplifying means each comprising a semi-conductor device having a semi-conductive body and a base, an emitter, and collector electrode in contact therewith, a tuned impedance matching transformer coupling the collector electrode of said first device with the emitter electrode of said second device, means connecting said base electrodes to a point of fixed reference potential, means coupled with the emitter electrode of said first device for applying an alternating current signal thereto, conductive means including a series biasing resistor coupling the emitter electrode of said first device with the emitter electrode of said second device, means connecting the base electrode of said first device to a point between said biasing resistor and the emitter of said second device wherein the emitter current of said second device electrode is operative to bias the base of said first device, signal detection means comprising a third semi-conductor device having a semi-conductive body and an emitter, a base, and a collector electrode in contact therewith, said third semi-conductor device having a characteristic wherein the potential on said collector electrode decreases in a direction toward said reference potential with increases in the amplitude of said alternating current signal, means including a fourth semi-conductor device coupling the collector electrode of said second device with the base electrode of said third device, load means including a signal output path connected with the collector electrode of said third device, biasing means for each of said electrodes of each of said devices, and means coupling the collector electrode of said third device with the base electrode of said second device wherein potential variations of the collector electrode of said third device are applied to the base electrode of said second device, said potential variations being effective to alter the gain of said second device wherein the emitter current of said second device is varied thereby to alter the gain of said first device, the gain of said first device thereby being decreased more rapidly than the gain of said second device.

9. In a radio frequency signal receiver the combination comprising, a source of direct current automatic gain control potential including alternating current signal detection means, said means comprising a semi-conductor device having a semi-conductive body and a base, an emitter, and a collector electrode in contact therewith, energization means for biasing said emitter and base electrodes in a relatively conducting direction and said collector and base electrodes in a relatively non-conducting direction, load means including a resistor coupled with said collector electrode, conductive circuit means coupled to the junction of said resistor and said collector electrode for deriving an automatic gain control potential proportional to an alternating current signal, a first and a second semi-conductor signal amplifying device connected in cascade relationship, each of said devices having a semi-conductive body and an input, an output and a common electrode in contact therewith, signal conductive means coupling said second device with said signal detection means, and direct current conductive means connected with said conductive circuit means and the common electrodes of said second device for applying said automatic gain control potential to the common electrode of said second device for controlling the gain of said first and second device, the gain of said first device thereby being decreased more rapidly than the gain of said second device.

10. In a radio receiver, the combination comprising, signal detection means including a semi-conductor device having a semi-conductive body and an emitter, a base, and a collector electrode in contact therewith, means connecting said emitter electrode to a point of fixed reference potential, said semi-conductor device having a characteristic wherein the potential of said collector electrode approach said fixed reference potential with increases in the amplitude of an applied alternating current signal, a first and second signal amplifying device each having a semi-conductive body, and a base, an emitter, and a collector electrode in contact therewith, means coupling the emitter electrode of said first device with the emitter electrode of said second device, means coupling the collector electrode of said second device with the base electrode of said semi-conductor device, biasing means for each of said electrodes including an impedance element coupled between the emitter electrodes of said first and second device wherein the emitter electrode current of said second device is operative to bias the base electrode of said second device, and means coupled between the collector electrode of said semi-conductor device and the base electrode of said second device wherein the potential variations of the collector electrode of said semi-conductor device are applied to the base electrode of said second device to decrease the gain and the emitter electrode current of said second device thereby to decrease the gain of said first device, the gain of said first device thereby being decreased more rapidly than the gain of said second device.

11. An automatic gain control system for radio receivers and the like comprising in combination, signal detection means providing an automatic gain control signal which varies with variations in a received signal, a first semi-conductor signal amplifying device coupled with said signal detection means and having at least a base electrode responsive to said automatic gain control signal for controlling the gain thereof and an emitter electrode, a second semi-conductor signal amplifying device coupled with said first signal amplifying device and having at least an emitter electrode, and conductive circuit means coupled with the emitter electrode of said second signal amplifying device and connected in circuit to be traversed by the current through the emitter electrode of said first signal amplifying device to control the gain of said second device, the gain of said second device being thereby decreased more rapidly than the gain of said first device.

12. An automatic gain control system for signal receiving systems comprising, in combination, signal detection means providing an automatic gain control signal which varies with variations in a received signal, a first transistor including a pair of electrodes defining an input circuit for said first transistors and an output electrode which defines with one of said pair of electrodes an output circuit for said first transistor, a second transistor including a pair of electrodes defining an input circuit for said second transistor and an output electrode which defines with one of said pair of electrodes of said second transistor an output circuit therefor, means for applying an input signal to the input circuit of said first transistor, means coupling the output circuit of said first transistor with the input circuit of said second transistor to provide signal translation therebetween, means coupling the output circuit of said second transistor with said signal detection means to provide signal translation therebetween, means for deriving an automatic gain control signal from said signal detection means, direct-current conductive means connecting said signal detection means with one of said pair of electrodes of said second transistor to control the current conducting condition and gain thereof inversely with increases of signal strength, and means for decreasing the gain of said first transistor more rapidly than the gain of said second transistor including means direct-current conductively connecting one of the electrodes of said second transistor with one of said pair of electrodes of said first transistor to reduce the current conducting condition and gain of said first transistor in accordance with a reduction in the current conducting condition and gain of said second transistor.

References Cited in the file of this patent

UNITED STATES PATENTS

| | | |
|---|---|---|
| 1,978,182 | Wilhelm | Oct. 23, 1934 |
| 2,041,150 | Roberts | May 19, 1936 |
| 2,106,207 | Crossley et al. | Jan. 25, 1938 |
| 2,207,905 | Weagent | July 16, 1940 |
| 2,243,423 | Hollingsworth | May 27, 1941 |
| 2,620,448 | Wallace | Dec. 2, 1952 |
| 2,647,957 | Mallinckrodt | Aug. 4, 1953 |

OTHER REFERENCES

Proceedings IRE, November 1952, pp. 1490–1494.